United States Patent
Ye et al.

(10) Patent No.: US 10,827,627 B2
(45) Date of Patent: Nov. 3, 2020

(54) REDUCTION OF INSERTION LOSS IN PRINTED CIRCUIT BOARD SIGNAL TRACES

(71) Applicant: Intel Corporation, Santa Clara, CA (US)

(72) Inventors: Xiaoning Ye, Portland, OR (US); Jimmy Hsu, Taoyuan (TW)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/360,216

(22) Filed: Mar. 21, 2019

(65) Prior Publication Data
US 2019/0223299 A1   Jul. 18, 2019

(51) Int. Cl.
| | |
|---|---|
| H05K 1/03 | (2006.01) |
| H05K 3/46 | (2006.01) |
| H05K 3/34 | (2006.01) |
| H05K 3/38 | (2006.01) |
| H05K 1/09 | (2006.01) |
| H05K 3/00 | (2006.01) |
| H05K 1/02 | (2006.01) |

(52) U.S. Cl.
CPC .......... *H05K 3/4676* (2013.01); *H05K 1/036* (2013.01); *H05K 1/092* (2013.01); *H05K 3/0017* (2013.01); *H05K 3/3452* (2013.01); *H05K 3/386* (2013.01); *H05K 1/0242* (2013.01); *H05K 3/4673* (2013.01)

(58) Field of Classification Search
CPC .... H05K 3/386; H05K 3/4644; H05K 3/4652; H05K 1/036; H05K 3/056
See application file for complete search history.

(56) References Cited

U.S. PATENT DOCUMENTS

| | | | | |
|---|---|---|---|---|
| 4,647,508 | A * | 3/1987 | Gazit | B32B 15/08 428/421 |
| 2005/0121229 | A1* | 6/2005 | Takai | B32B 15/08 174/261 |
| 2005/0202261 | A1* | 9/2005 | Takai | H05K 3/28 428/458 |
| 2009/0323300 | A1* | 12/2009 | Fujimoto | B32B 7/12 361/784 |
| 2012/0160544 | A1* | 6/2012 | Antesberger | H05K 3/4623 174/251 |
| 2013/0011645 | A1* | 1/2013 | Carney | B32B 27/08 428/220 |

* cited by examiner

*Primary Examiner* — Hoa C Nguyen
(74) *Attorney, Agent, or Firm* — Schwabe, Williamson & Wyatt, PC (57) ABSTRACT

A printed circuit board, according one embodiment, includes a reference layer; a dielectric layer disposed on the reference layer; and a conductor layer adhered to the dielectric layer with an adhesive layer disposed between the dielectric layer and the conductor layer. The conductor layer has a smooth surface facing the dielectric layer having a roughness (Rz) of less than two microns.

7 Claims, 10 Drawing Sheets

REDUCTION OF INSERTION LOSS IN PRINTED CIRCUIT BOARD SIGNAL TRACES

DESCRIPTION OF EMBODIMENTS

Described herein are technologies directed to an enhanced printed circuit board (PCB) in which a conductor layer (typically copper foil) is adhered to an underlying dielectric layer using an adhesive layer instead of making the surface of the conductor layer rough. In embodiments, therefore, a surface of the conductor layer that is adhered to the underlying dielectric layer is retained as smooth, e.g., to have a low roughness (Rz) of less than two microns. The adhesive layer may be a resin made of at least a perfluoroalkoxy copolymer (PFA) or similar material, and adapted to function under the heat and pressure employed to form PCBs from a stackup of PCB layers. This adhesive layer provides sufficient peel strength while decreasing insertion loss by virtue of the smooth conductor layer surface, thus providing increased signal integrity in the signal traces of the conductor layer that are formed after etching.

Figure 1:
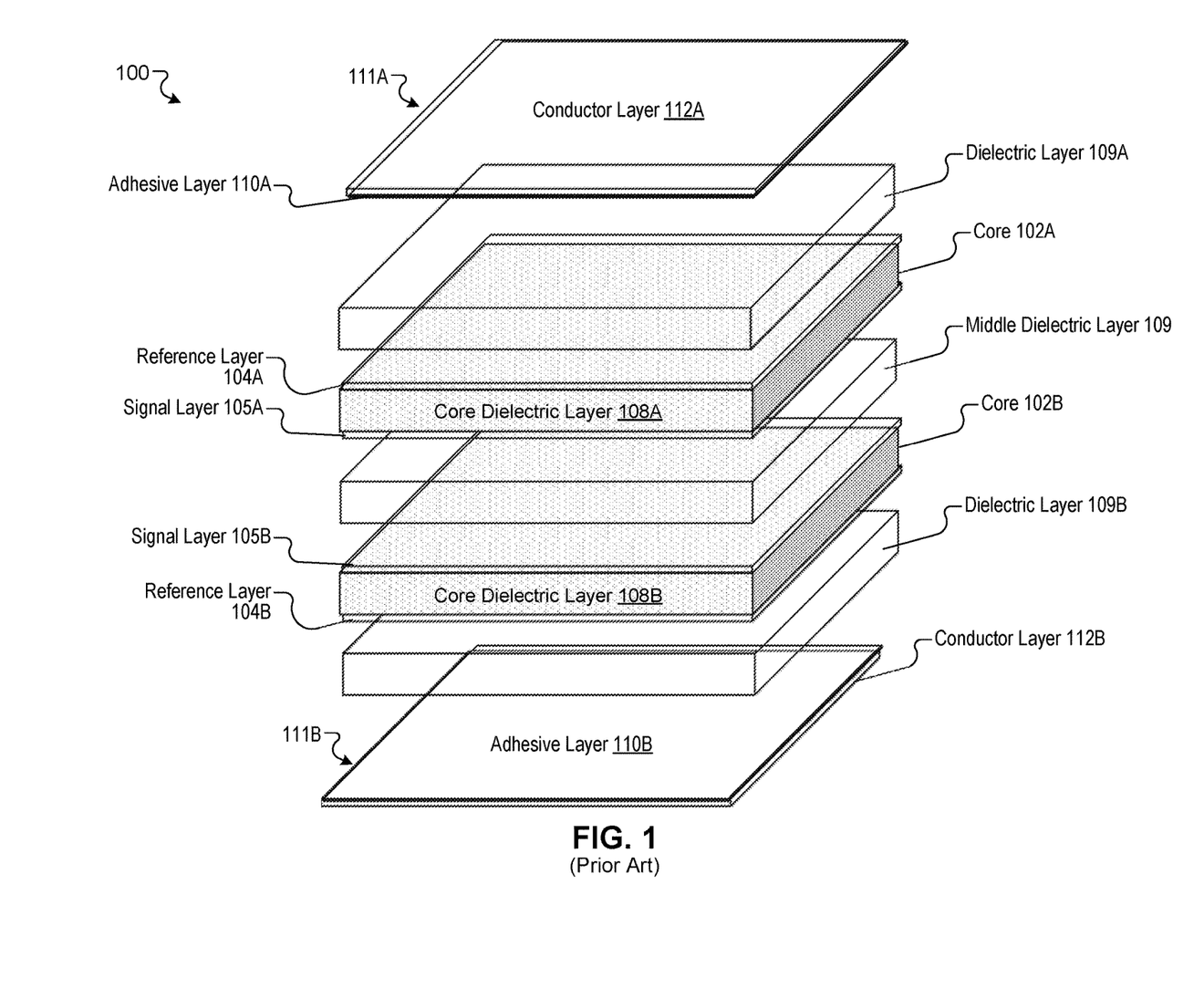
FIG. 1 is an exploded, perspective view of a set of layers that make up a multi-layer printed circuit board (PCB), according to certain embodiments.

FIG. 1 is an exploded, perspective view of a set of layers (also known as a stackup) that make up a multi-layer PCB 100, according to certain embodiments. For example, the multi-layer PCB 100 may include a number of layers that may be repeated to generate stackups of varying numbers of repeated layers. For purposes of explanation, the multi-layer PCB 100 stackup of FIG. 1 includes a middle dielectric layer 109, and stacked to a first direction, a first core 102A, a first dielectric layer 109A, and a first combination layer 111A that includes a first conductor layer 112A and a first adhesive layer 110A. The first core 102A may further include a first reference layer 104A, a first core dielectric layer 108A, and a first signal layer 105A. In one embodiment, the middle dielectric layer 109 may be referred to as a third dielectric layer or a second dielectric layer depending on the number of dielectric layers.

In the embodiment of FIG. 1, the PCB 100 stackup may further include, stacked to a second direction away from the middle dielectric layer 109, a second core 102B, a second dielectric layer 109B, and a second combination layer 111B that includes a second conductor layer 112B and a second adhesive layer 110B. The second core 102B may further include a second reference layer 104B, a second core dielectric layer 108B, and a second signal layer 105B. In some embodiments, each of the first signal layer 105A and the second signal layer 105B are chemically etched to include multiple signal traces (e.g., stripline routing that provide interconnects for circuitry) before being combined into the stackup for PCB formation via heating.

In various embodiments, the first combination layer 111A and the second combination layer 111B may be purchased with the adhesive layers 110A and 110B, respectively, already disposed on the conductor layers 112A and 112B, respectively. In this way PCB manufacturers do not need to change or add steps into a current manufacturing process. Once the stackup is complete, the set of layers may be heated under pressure for a prescribed period of time to complete formation of the multi-layer PCB 100. In embodiments, the first and/or second conductor layers 112A and 112B are then also chemically etched to include multiple signal traces. The signals traces etched within the conductor layers and signal layers may be connected via through holes (not illustrated) drilled through the multi-layer PCB 100, to provide interconnects for circuitry, which may include integrate circuit chips adhered to the surface of the multi-layer PCB 100. As can be appreciated, additional dielectric layers interlayered with additional cores may be employed using the patterns of manufacturing as discussed herein to increase the thickness and available signal layers within the multi-layer PCB 100.

In various embodiments, the reference layers, the signal layers, and the conductor layers are conductive metal layers. The first and second conductor layers 112A and 112B are outer conductor layers, which are typically a copper foil. In embodiments, the various dielectric layers are a "prepreg," which is typically fiberglass impregnated with resin. The surfaces of outer conductor layers that are to be adhered to the prepreg (e.g., a dielectric) layer are conventionally roughened (see FIG. 2) to increase peel strength after the PCB formation process is complete. The roughness of the surface provides additional surface area and lateral forces on the conductor layer to help increase peel strength and prevent delamination.

The rough surface, however, has a negative side effect on the signal integrity of signal traces that remain after etching. More specifically, the surface roughness of the conductor layers significantly compromises the electrical performance for high frequency applications due to increased insertion loss in these signal traces. The insertion loss impacts the reliability of electrical signals in the signal traces and may require further engineering such as using more expensive materials, and as a last resort, using signal repeaters, all of which requires additional area, power, and costs. Many other engineering approaches to reduce the signal loss all significantly increase costs as well.

Figure 2:
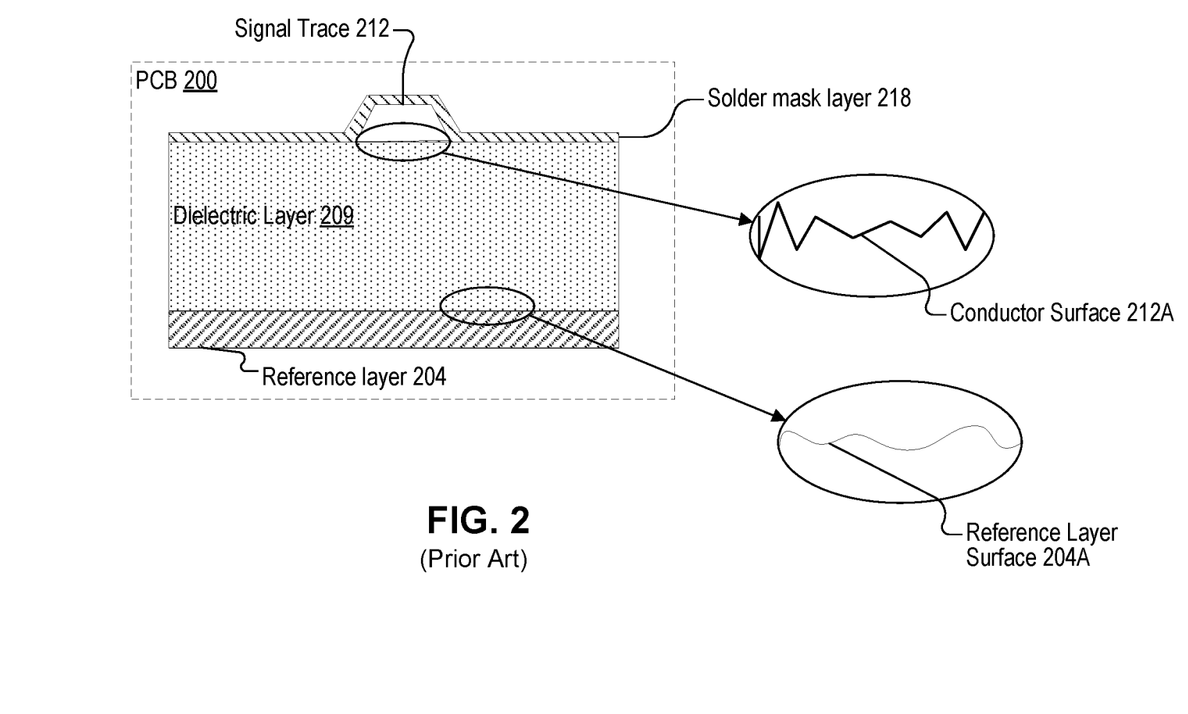
FIG. 2 is a side cross-sectional view of a conventional PCB in which a conductor layer has a rough surface that is attached to an underlying dielectric layer, according to certain embodiments.

FIG. 2 is a side cross-sectional view of a conventional PCB 200 in which a conductor layer has a rough surface that is attached to an underlying dielectric layer, according to certain embodiments. For purposes of explanation and according to an embodiment, the conventional PCB 200 includes a reference layer 204, a dielectric layer 209 disposed on the reference layer 204, and a signal trace 212 within the conductor layer disposed on the dielectric layer 209. The conventional PCB 200 may further include a solder mask layer 218 disposed on the conductor layer (which includes the signal trace). In embodiments, a conductor surface 212A that faces the dielectric layer 209 is rough as illustrated in the exploded, zoomed-in view. A reference layer surface 204A of the reference layer 204 that faces the dielectric layer 209 may also have a roughened surface, albeit not usually as rough as the conductor surface 212A.

Figure 3A:
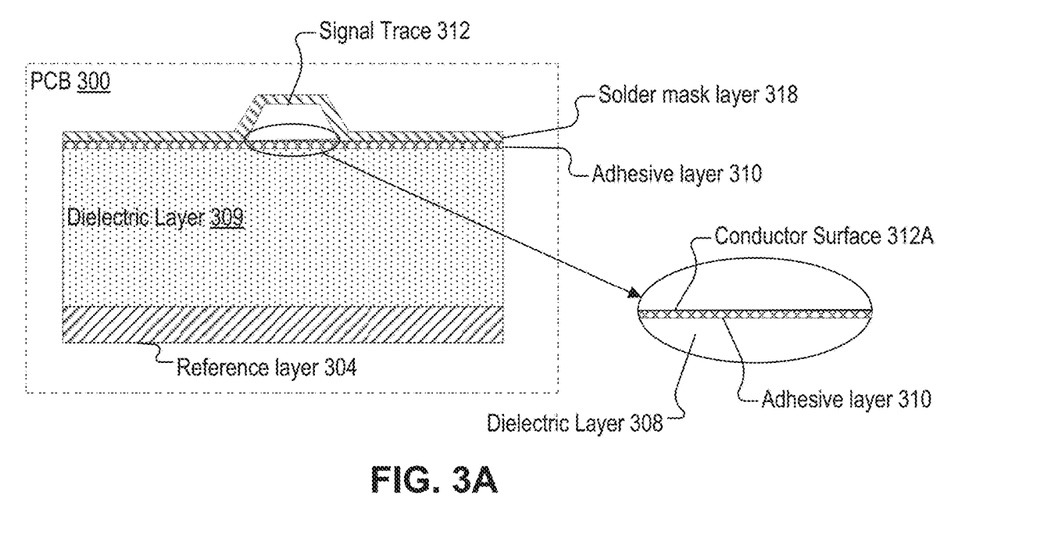
FIG. 3A is a side cross-sectional view of a PCB in which a conductor layer has a smooth surface that is adhered to an underlying dielectric layer using a particular adhesive, according to certain embodiments.
Figure 3B:
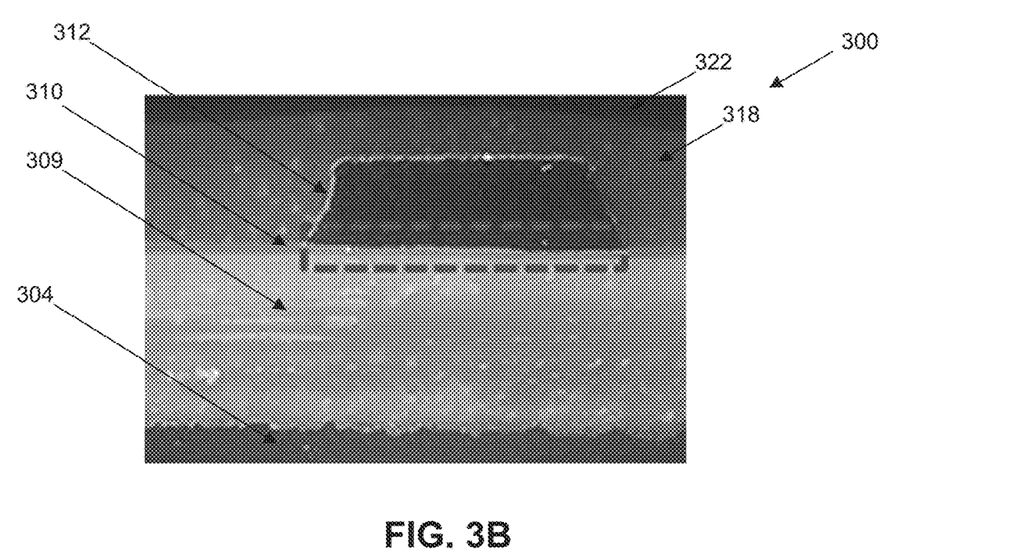
FIG. 3B is a side cross-sectional view of a scanning electron microscope (SEM) image of the PCB illustrated in FIG. 3A, according to one embodiment.

FIG. 3A is a side cross-sectional view of a PCB 300 in which a conductor layer has a smooth surface that is adhered to an underlying dielectric layer using a particular adhesive, according to certain embodiments. FIG. 3B is a side cross-sectional view of a scanning electron microscope (SEM) image of the PCB illustrated in FIG. 3A, according to one embodiment. In the certain embodiments, the PCB 300 includes a reference layer 304, a dielectric layer 309 disposed on the reference layer 304, and an adhesive layer 310 disposed on the dielectric layer 309. The PCB 300 may further include a signal trace 312 disposed on the adhesive layer 310, where the signal trace 312 was formed by chemically etching the conductor layer, e.g., the first or the second conductor layer 112A or 112B, which is best illustrated in FIG. 1. The PCB 300 may further include a solder mask layer 318 disposed on the signal trace 312 and the adhesive layer 310.

As illustrated in the zoomed-in view of the adhesive layer 310 and conductor layer boundary in FIG. 3A, the conductor layer, and thus the signal trace 312, has a conductor surface 312A that is smooth facing the dielectric layer 308. In embodiments, the conductor surface 312A has a roughness (Rz) of less than two microns. The adhesive layer 310 may be a resin made of at least a perfluoroalkoxy copolymer (PFA) or similar material, and adapted to function under the heat and pressure employed to form PCBs. Although the prepreg of the dielectric layer 309 includes a type of resin, the adhesive layer 310 provides an additional level of bonding (or peel) strength between the signal trace 312 (derived from the conductor layer 112A or 112B) and the dielectric layer 309, while eliminates the need of using a conductor with significantly increased roughness for conductor surface 312A.

Figure 3C:
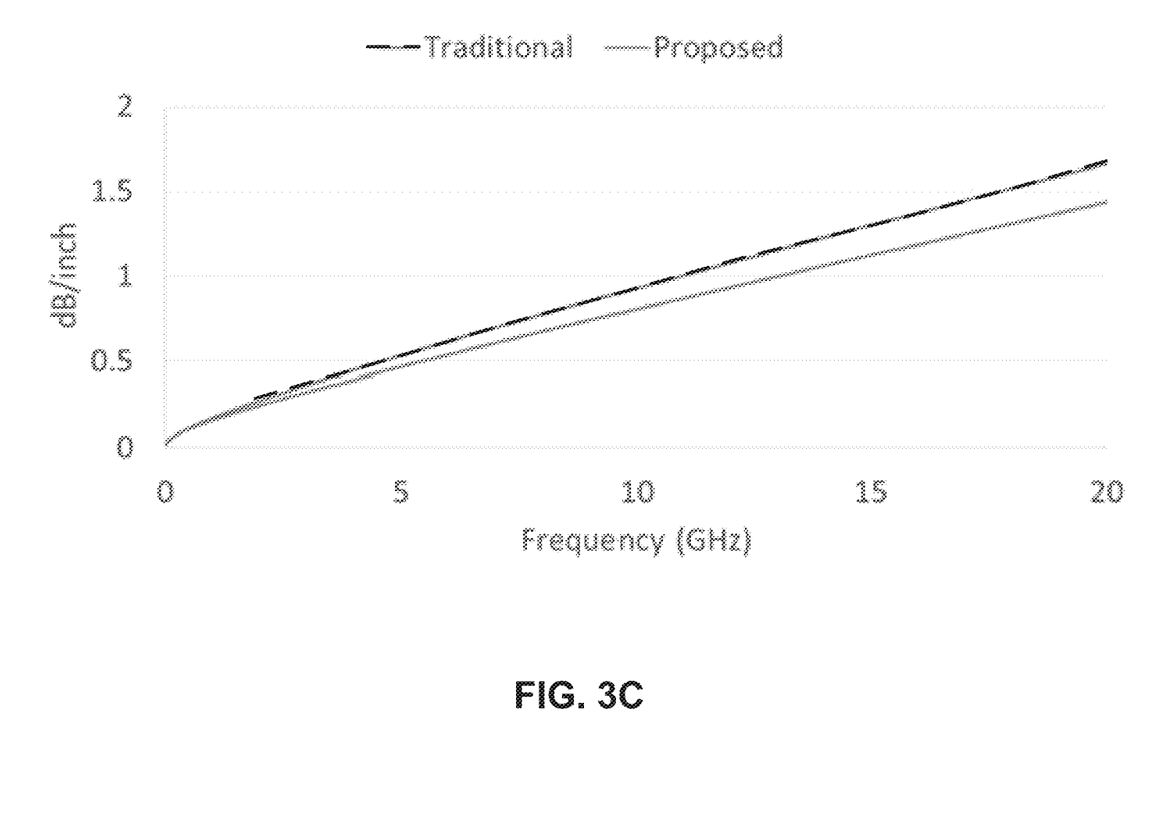
FIG. 3C is a graph comparing measured insertion loss between the conventional PCB (FIG. 2) and the PCB illustrated in FIG. 3B, according to an embodiment.

FIG. 3C is a graph comparing measured insertion loss between the conventional PCB 200 (FIG. 2) and the PCB 300 illustrated in FIG. 3B, according to an embodiment. The x-axis illustrates increasing frequency of the signal in the signal trace 312, and the y-axis illustrates a signal loss level in decibels per inch (dB/inch). As illustrated, with increasing frequency, the insertion loss is lessened up to around 14% at higher frequencies approaching 20 GHz. Furthermore, as illustrated in Table 1, the measured peel strength is still above the requirement of greater than or equal to six pounds per inch. The pad strength level of being over 500 pounds per square inch (PSI) was also met.

TABLE 1

| Item | Requirement | Conventional | With Adhesive Layer |
|---|---|---|---|
| Copper Foil | — | Rough | Smooth |
| Peeling Strength | ≥6 lb./in. | 8 | 7 |
| Pad Strength (Copper Defined) | ≥500 PSI | Pass | Pass |
| Pad Strength (S/M Defined) | | Pass | Pass |

Figure 3D:
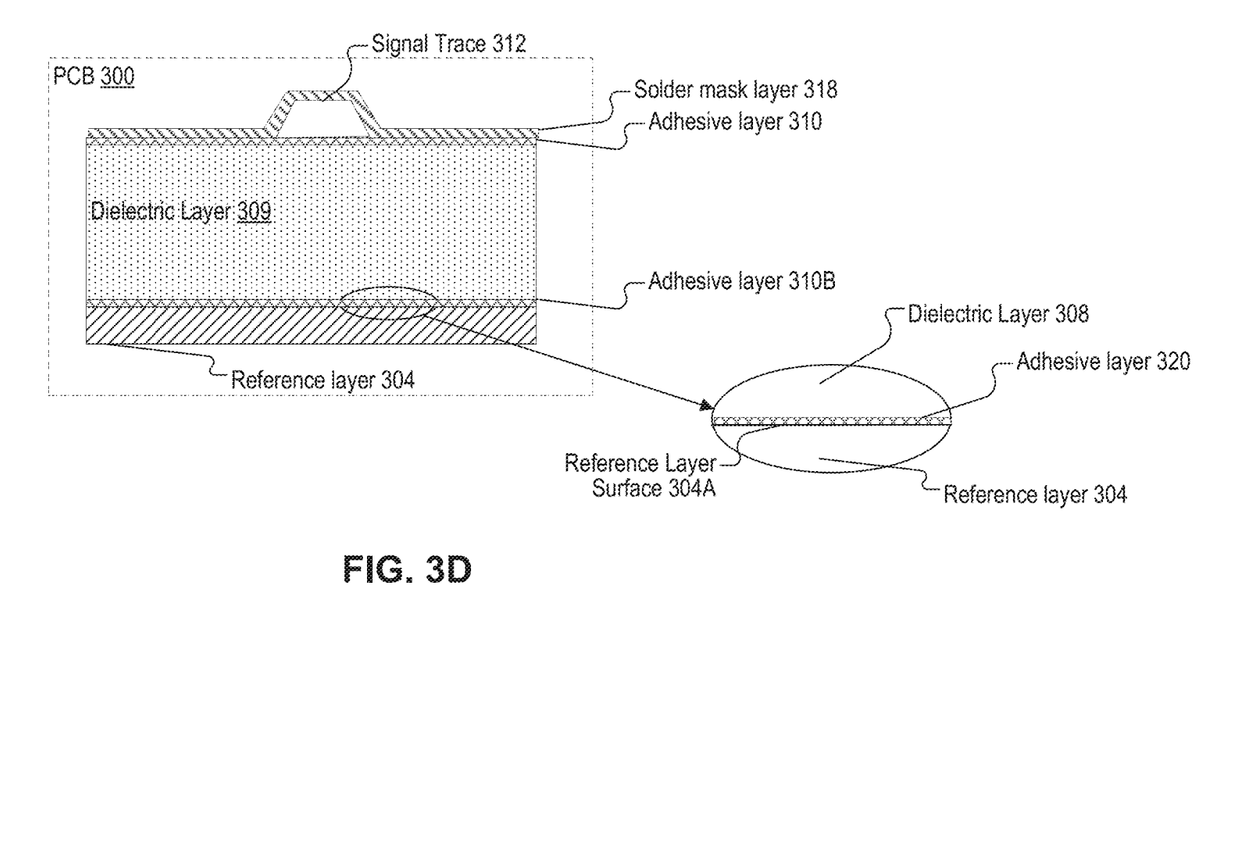
FIG. 3D is a side cross-sectional view of the PCB of FIG. 3A in which both the conductor layer and the reference layer has a smooth surface that is adhered to the underlying dielectric layer using the particular adhesive, according to certain embodiments.

FIG. 3D is a side cross-sectional view of the PCB 300 of FIG. 3A in which both the conductor layer and the reference layer 304 has a smooth surface that is adhered to the underlying dielectric layer 308 using the particular adhesive, according to certain embodiments. In this further embodiment, a second adhesive layer 310B is applied to a reference layer surface 304A of the reference layer 304 before the PCB stackup of layers is heated. By making the reference layer surface 304A also be smooth, e.g., having a roughness (Rz) of less than two microns, the reference layer 304 may provide additional benefit to reduction of loss of return signals passing through the reference layer 304.

Figure 4:
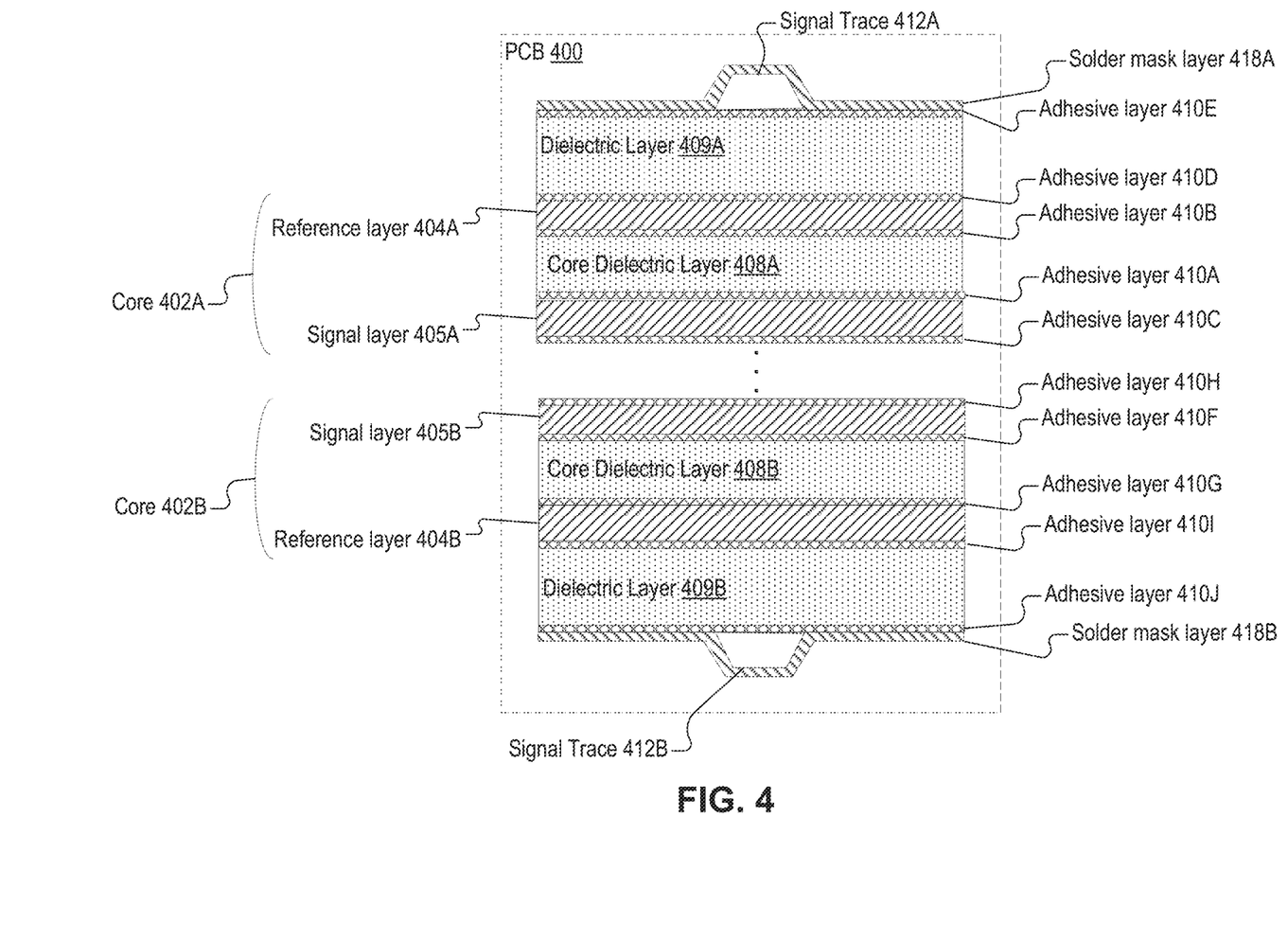
FIG. 4 is a side cross-sectional view of the multi-layer PCB of FIG. 1 that employs several adhesive layers between the various conductor and dielectric layers of the PCB stackup according to certain embodiments.

FIG. 4 is a side cross-sectional view of a multi-layer PCB 400, similar to the multi-layer PCB 100 of FIG. 1, but which employs several adhesive layers between the various conductor and dielectric layers of the PCB stackup according to various embodiments. In the illustrated embodiments, the multi-layer PCB 400 stackup includes, on a first side thereof, a first core 402A, a first dielectric layer 409A disposed on the first core 402A, and a top conductor layer disposed on the first dielectric layer 409A that is chemically etched to include one or more signal trace 412A. A first solder mask layer 418A may be disposed on the etched one or more signal trace 412A. Additionally, the first core 402A may include a first core dielectric layer 408A, a first reference layer 404A, and a first signal layer 405A.

In embodiments, the first core 402A optionally includes (e.g., is manufactured with) a first adhesive layer 410A disposed between the first core dielectric layer 408A and the first signal layer 405A and a second adhesive layer 410B disposed between the first core dielectric layer 408A and the first reference layer 404A. The multi-layer PCB 400 stackup may further include a third adhesive layer 410C disposed on an outer surface of the first signal layer 405A and a fourth adhesive layer 410D disposed on an outer surface of the first reference layer 404A. In this way, the first reference layer 404A may have a smooth surface facing the first dielectric layer 409A and the first signal layer 405A may have a smooth surface facing the middle dielectric layer 109 (FIG. 1) or other intervening dielectric layer. Further, the multi-layer PCB 400 stackup may include a fifth adhesive layer 410E disposed between the first dielectric layer 409A and the combination of the one or more signal trace 412A and the first solder mask layer 418A.

In embodiments, a second side of the multi-layer PCB 400 stackup may include a second core 402B, a second dielectric layer 409B disposed on the second core 402B, and a bottom conductor layer disposed on the second dielectric layer 409B that is chemically etched to include one or more signal trace 412B. A second solder mask layer 418B may be disposed on the etched one or more signal trace 412B. Additionally, the second core 402B may include a second core dielectric layer 408B, a second reference layer 404B, and a second signal layer 405B.

In embodiments, the second core 402B optionally includes (e.g., is manufactured with) a sixth adhesive layer 410F disposed between the second core dielectric layer 408A and the second signal layer 405B and a seventh adhesive layer 410G disposed between the second core dielectric layer 408B and the second reference layer 404B. The multi-layer PCB 400 stackup may further include an eighth adhesive layer 410H disposed on an outer surface of the second signal layer 405B and a ninth adhesive layer 410I disposed on an outer surface of the second reference layer 404B. In this way, the second reference layer 404B may have a smooth surface facing the second dielectric layer 409B and the second signal layer 405B may have a smooth surface facing the middle dielectric layer 109 (FIG. 1) or other intervening dielectric layer. Further, the multi-layer PCB 400 stackup may include a tenth adhesive layer 410J disposed between the second dielectric layer 409B and the combination of the one or more signal trace 412B and the second solder mask layer 418B.

As discussed, either or both of the first and second signal layers 405A and 405B may also be chemically etched to form multiple signal traces before being inserted into the multi-layer PCB 400 stackup. Once the stackup is complete, the stackup of layers may be heated under pressure for a prescribed period of time to complete formation of the multi-layer PCB 400. In embodiments, through-holes may be drilled through the multi-layer PCB 400 to interconnect the signal traces on the signal layers with several of the one or more signal trace 412A and 412B in the conductor layers 112A and 112B, respectively. In embodiments, the signal traces and the reference layers may be formed from copper foil or other conductive metal. Where the adhesive layers are deployed, the conductive metal may be made smooth, e.g., have a roughness of less than two microns.

It should be noted that patterns of the PCB layers disclosed with reference to the various Figures herein may be repeated additional times to manufacture PCBs of many more layers, including four, six, eight, or more repeating layers. Furthermore, the adhesive layers deployed below the top layers are optional, where each adhesive layer may be used in some combinations and not used in other combinations of the layers of the PCB stackup. Accordingly, the number adhesive layers illustrated in FIG. 4 is exemplary for purposes of explanation.

Figure 5A:
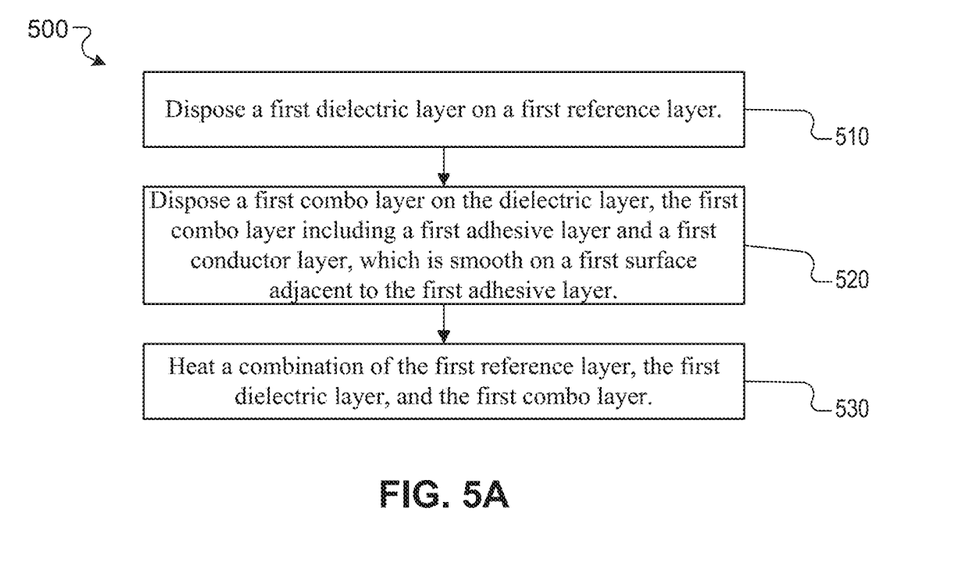
FIG. 5A is a flow chart of a method of forming a printed circuit board according to certain embodiments.

FIG. 5A is a flow chart of a method 500 of forming a printed circuit board according to certain embodiments. The method 500 may be executed using printed circuit board processing equipment according to the certain embodiments as set forth below. In the certain embodiments, the method 500 begins by disposing a first dielectric layer on a first reference layer (510). The method 500 may continue by disposing a first combination layer on the first dielectric layer, the first combination layer including a first adhesive layer disposed on a first conductor layer, the first adhesive layer being in physical contact with the first dielectric layer, wherein the first conductor layer is smooth on at least a first surface that is adjacent to the first adhesive layer (520). In embodiments, the first surface has a roughness (Rz) of less than two microns. The method 500 may continue with adhering, using the first adhesive layer, the first surface of the first conductor layer to the first dielectric layer (530). The method 500 may continue with heating a combination of the first reference layer, the first dielectric layer, and the first combination layer, to generate a PCB (550).

While not specifically enumerated, the method 500 may further include etching the first conductor layer to include a plurality of signal traces and disposing a solder mask layer on the etched first conductor layer. In alternative embodiments, an additional adhesive layer is interposed between the first reference layer and the first dielectric layer.

In one embodiment, the first reference layer is within a core, which further includes a first signal layer opposite to the first reference layer. The method 500 may further include, before the heating (block 530) disposing a second dielectric layer on the core and disposing a second adhesive layer between the first reference layer and the first dielectric layer, wherein the first reference layer has a smooth surface facing the first dielectric layer. The method 500 may further include, before the heating, disposing a third adhesive layer between the first signal layer and the second dielectric layer, wherein the first signal layer has a smooth surface facing the second dielectric layer.

Figure 5B:
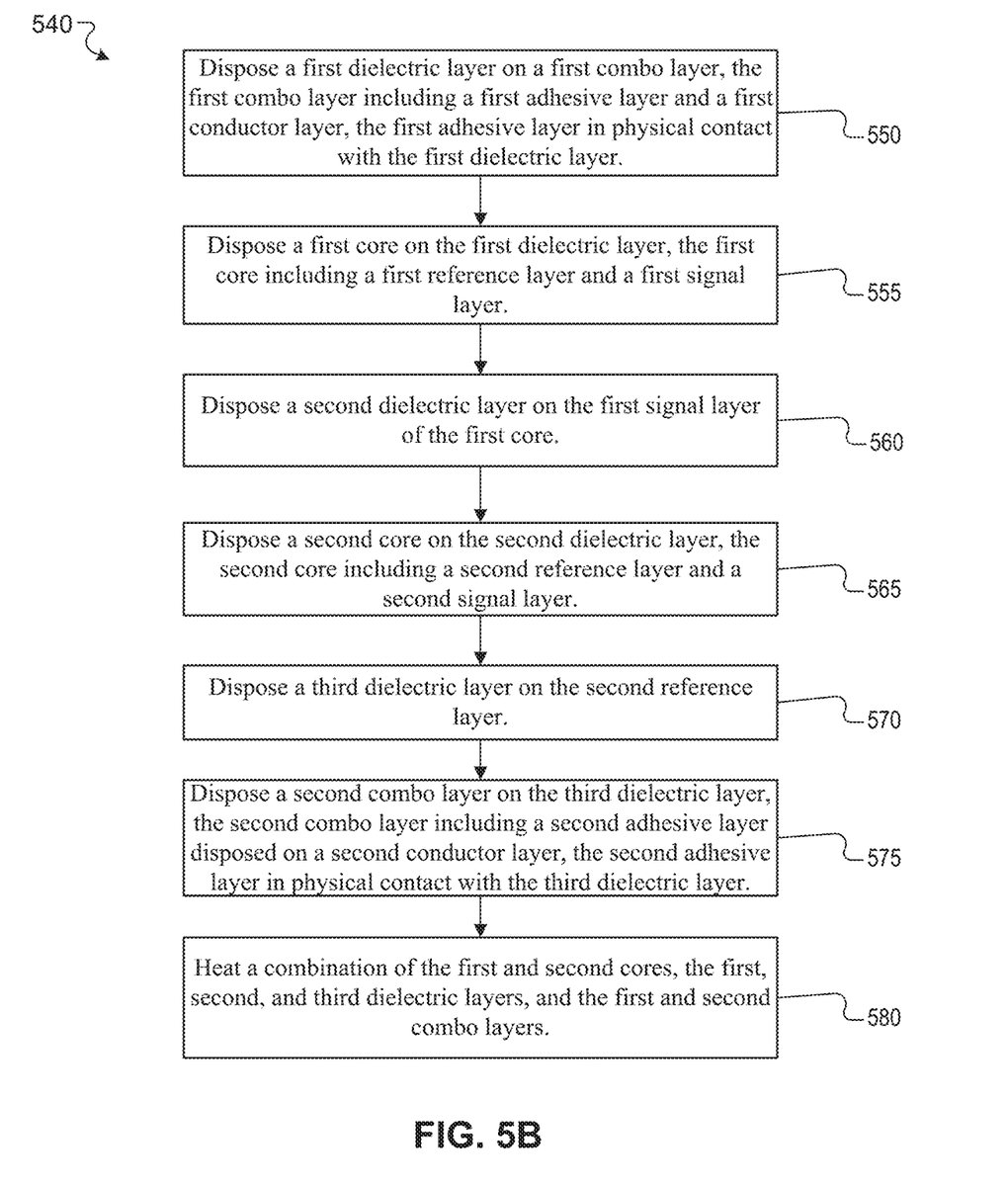
FIG. 5B is a flow chart of a method of forming a printed circuit board according to additional embodiments.

FIG. 5B is a flow chart of a method 540 of forming a printed circuit board according to additional embodiments. The method 540 may be executed using printed circuit board processing equipment according to the certain embodiments as set forth below. In the certain embodiments, the method 540 begins by disposing a first dielectric layer on a first combination layer, the first combination layer including a first adhesive layer disposed on a first conductor layer, the first adhesive layer being in physical contact with the first dielectric layer, wherein the first conductor layer is smooth on at least a first surface that is adjacent to the first adhesive layer (550). The method 540 may continue with disposing a first core on the first dielectric layer, the first core including a first reference layer and a first signal layer (555). The method 540 may continue with disposing a second dielectric layer on the first signal layer of the first core (560). The method 540 may continue with disposing a second core on the second dielectric layer, the second core including a second reference layer and a second signal layer (565). The step at block 565 may further include disposing additional layers of prepreg and cores as discussed herein.

With additional reference to FIG. 5B, the method 540 may continue with the disposing a third dielectric layer on the second reference layer of the second core (570). The method 540 may continue with disposing a second combination layer on the third dielectric layer, the second combination layer including a second adhesive layer disposed on a second conductor layer, the second adhesive layer being in physical contact with the third dielectric layer, wherein the second conductor layer is smooth on at least a second surface that is adjacent to the second adhesive layer (575). The first surface and the second surface each may have a roughness (Rz) of less than two microns. The method 540 may continue with heating a combination of the first and second cores, the first, second, and third dielectric layers, and the first and second combination layers (580).

While not specifically enumerated, the method 540 may further include etching each of the first conductor layer and the second conductor layer to include a plurality of signal traces and disposing a solder mask layer on each of the etched conductor layers according to a further embodiment. The method 540 may also further include etching the first signal layer and the second signal layer to each include a plurality of signal traces.

In one embodiment, the method 540 may further include, before the heating in block 580, disposing a third adhesive layer between the second reference layer and the third dielectric layer, wherein the second reference layer has a smooth surface facing the third dielectric layer. The method 540 may further include, before the heating, disposing a fourth adhesive layer between the second signal layer and the second dielectric layer, wherein the second signal layer has a smooth surface facing the second dielectric layer.

Figure 6:
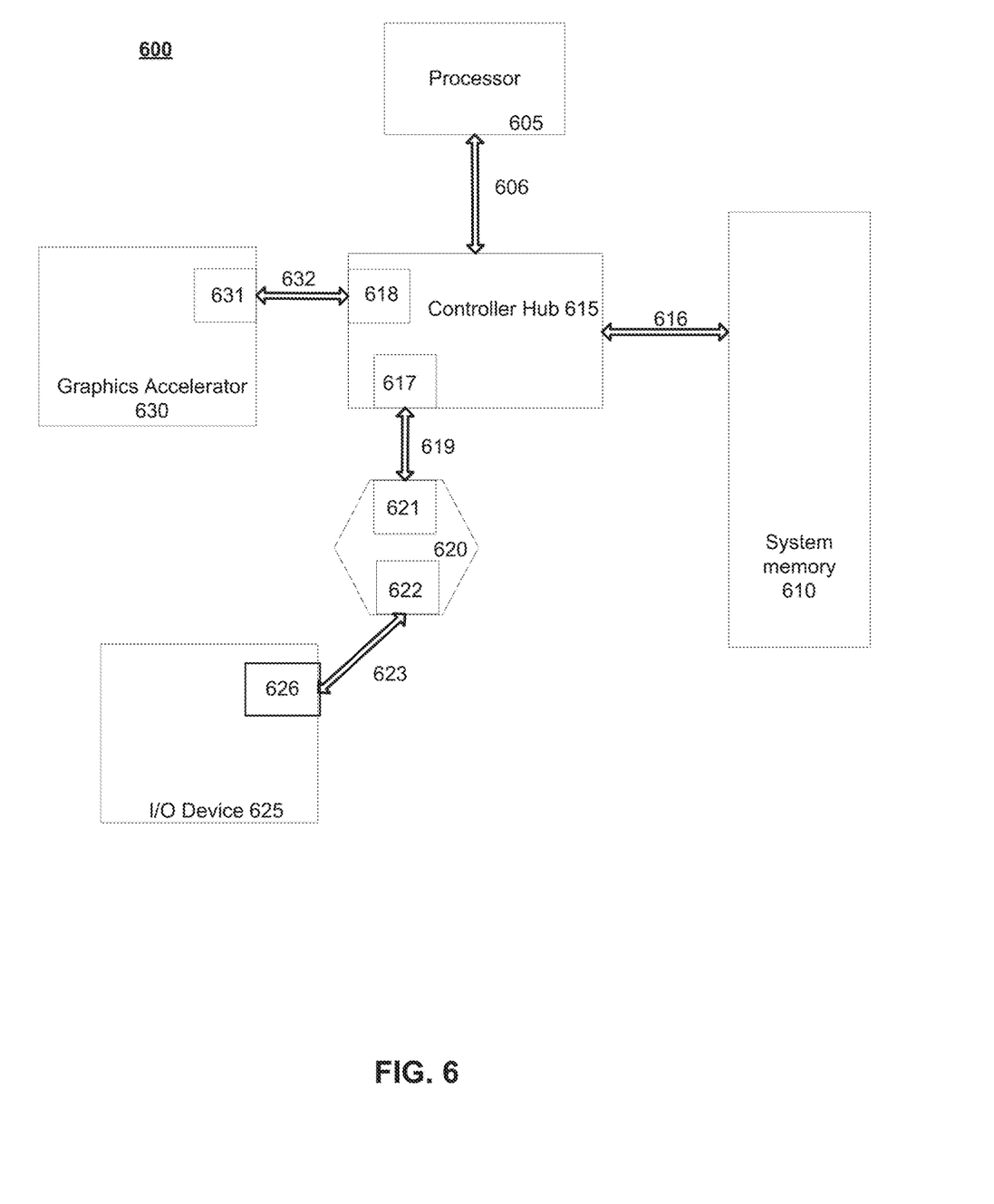
FIG. 6 is a computer system with multiple interconnects, according to certain embodiments.

FIG. 6 is a computer system 600 with multiple interconnects, according to certain embodiments. System 600 includes processor 605 and system memory 610 coupled to controller hub 615. Processor 605 includes any processing element, such as a microprocessor, a host processor, an embedded processor, a co-processor, or other processor. Processor 605 is coupled to controller hub 615 through front-side bus (FSB) 606. In one embodiment, FSB 606 is a serial point-to-point interconnect as described below. In another embodiment, FSB 606 (e.g., link) includes a serial, differential interconnect architecture that is compliant with different interconnect standards.

System memory 610 includes any memory device, such as random access memory (RAM), non-volatile (NV) memory, or other memory accessible by devices in system 600. System memory 610 is coupled to controller hub 615 through memory interface 616. Examples of a memory interface include a double-data rate (DDR) memory interface, a dual-channel DDR memory interface, and a dynamic RAM (DRAM) memory interface.

In one embodiment, controller hub 615 is a root hub, root complex, or root controller. Examples of controller hub 615 include a chipset, a memory controller hub (MCH), a north bridge, an interconnect controller hub (ICH) a south bridge, and a root controller/hub. Often the term chipset refers to two physically separate controller hubs, i.e. a memory controller hub (MCH) coupled to an interconnect controller hub (ICH). Note that current systems often include the MCH integrated with processor 605, while controller 615 is to communicate with I/O devices, in a similar manner as described below. In some embodiments, peer-to-peer routing is optionally supported through root complex (e.g., controller 615).

Here, controller hub 615 is coupled to switch/bridge 620 through serial link 619. Input/output modules 617 and 621, which may also be referred to as interfaces/ports 617 and 621, include/implement a layered protocol stack to provide communication between controller hub 615 and switch 620. In one embodiment, multiple devices are capable of being coupled to switch 620.

Switch/bridge 620 routes packets/messages from device 625 upstream, i.e. up a hierarchy towards a root complex, to controller hub 615 and downstream, i.e. down a hierarchy away from a root controller, from processor 605 or system memory 610 to device 625. Switch 620, in one embodiment, is referred to as a logical assembly of multiple virtual PCI-to-PCI bridge devices. Device 625 includes any internal or external device or component to be coupled to an electronic system, such as an I/O device, a Network Interface Controller (NIC), an add-in card, an audio processor, a network processor, a hard-drive, a storage device, a CD/DVD ROM, a monitor, a printer, a mouse, a keyboard, a router, a portable storage device, a Fire wire device, a Universal Serial Bus (USB) device, a scanner, and other input/output devices. Often in the PCIe® vernacular, such as device, is referred to as an endpoint. Although not specifically shown, device 625 may include a PCIe® to PCI/PCI-X bridge to support legacy or other version PCI devices. Endpoint devices in PCIe® are often classified as legacy, PCIe®, or root complex integrated endpoints.

Graphics accelerator 630 is also coupled to controller hub 615 through serial link 632. In one embodiment, graphics accelerator 630 is coupled to an MCH, which is coupled to an ICH. Switch 620, and accordingly I/O device 625, is then coupled to the ICH. I/O modules 631 and 618 are also to implement a layered protocol stack to communicate between graphics accelerator 630 and controller hub 615. Similar to the MCH discussion above, a graphics controller or the graphics accelerator 630 itself may be integrated in processor 605.

I/O device 625 includes an interface 626 and switch/bridge 620 includes an interface 622. Interface 626 is coupled to interface 622 via serial link 623.

In one embodiment, short range wireless engines including a WLAN unit and a Bluetooth® unit may couple to processor 605 via an interconnect according to a PCIe® protocol, e.g., in accordance with the PCI Express® Specification Base Specification version 3.0 (published Jan. 17, 2004), or another such protocol such as a serial data input/output (SDIO) standard. Of course, the actual physical connection between these peripheral devices, which may be configured on one or more add-in cards, can be by way of the NGFF connectors adapted to a motherboard. Using WLAN unit, Wi-Fi® communications in accordance with a given Institute of Electrical and Electronics Engineers (IEEE) 802.11 standard can be realized, while via a unit using the Bluetooth® technology, short range communications via a Bluetooth® protocol can occur. In another embodiment, these units may communicate with processor 605 via, e.g., a USB link or a universal asynchronous receiver transmitter (UART) link.

One or more of the components of system 600 may be coupled by a connector that is formed as a signal trace on a PCB as described within. For example, one or more of FSB 606, memory interface 616, serial link 619, serial link 623, or serial link 632 may be formed over an adhesive layer, e.g., the adhesive layer 310 within a PCB formation process.

Figure 7:
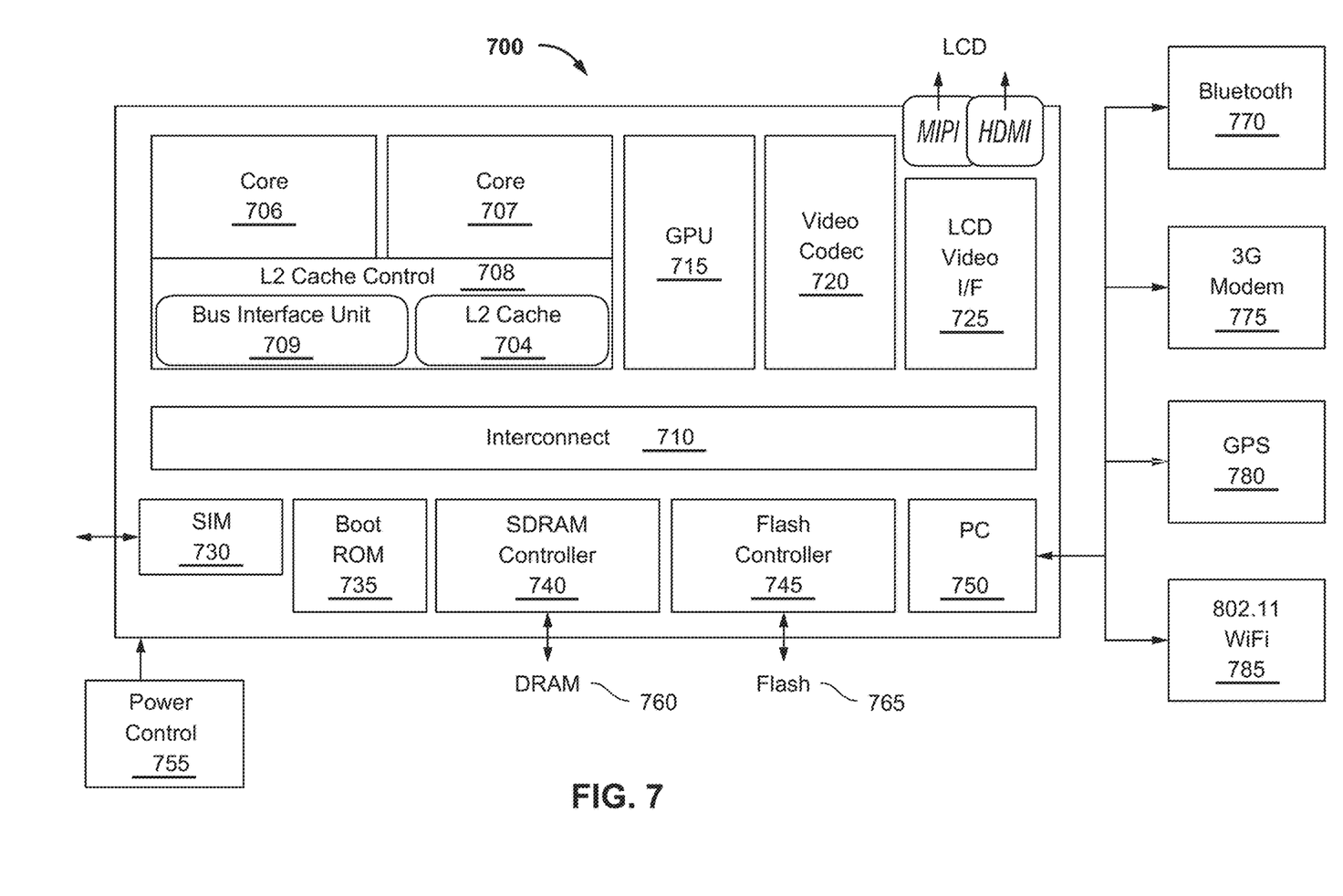
FIG. 7 is a system on a chip (SOC) design, according to certain embodiments.

Turning next to FIG. 7, an embodiment of a system on-chip (SOC) design in accordance with the disclosures is depicted. As a specific illustrative example, SOC 700 is included in user equipment (UE). In one embodiment, UE refers to any device to be used by an end-user to communicate, such as a hand-held phone, smartphone, tablet, ultra-thin notebook, notebook with broadband adapter, or any other similar communication device. Often a UE connects to a base station or node, which potentially corresponds in nature to a mobile station (MS) in a GSM network.

Here, SOC 700 includes 2 cores—706 and 707. Similar to the discussion above, cores 706 and 707 may conform to an Instruction Set Architecture, such as an Intel® Architecture Core™-based processor, an Advanced Micro Devices, Inc. (AMD) processor, a MIPS-based processor, an ARM-based processor design, or a customer thereof, as well as their licensees or adopters. Cores 706 and 707 are coupled to cache control 708 that is associated with bus interface unit 709 and L2 cache 704 to communicate with other parts of system 700. Interconnect 710 includes an on-chip interconnect, such as an IOSF, AMBA, or other interconnect discussed above, which potentially implements one or more aspects of the described disclosure.

Interconnect 710 (e.g., interface) provides communication channels to the other components, such as a Subscriber Identity Module (SIM) 730 to interface with a SIM card, a boot ROM 735 to hold boot code for execution by cores 706 and 707 to initialize and boot SOC 700, a SDRAM controller 740 to interface with external memory (e.g. DRAM 760), a flash controller 745 to interface with non-volatile memory (e.g. Flash 765), a peripheral control 750 (e.g. Serial Peripheral Interface) to interface with peripherals, video codecs 720 and Video interface 725 to display and receive input (e.g. touch enabled input), GPU 715 to perform graphics related computations, etc. Any of these interfaces may incorporate aspects of the disclosure described herein.

In some embodiments, interconnect 710 may be formed as a sign trace on a PCB as described herein. For example, interconnect 710 may be formed over an adhesive layer, e.g., the adhesive layer 310 within the disclosed PCB formation process to couple one or more components of the SOC 700.

In addition, the system illustrates peripherals for communication, such as a Bluetooth® module 770, 3G modem 775, GPS 785, and Wi-Fi® 785. Note as stated above, a UE includes a radio for communication. As a result, these peripheral communication modules are not all required. However, in a UE some form a radio for external communication is to be included. The SOC 700 may be coupled to the peripherals via a connector 130 etched as a signal trace of a PCB formed as disclosed herein.

The following examples pertain to further embodiments.

Example 1 is a printed circuit board comprising: 1) a reference layer; 2) a dielectric layer disposed on the reference layer; and 3) a conductor layer adhered to the dielectric layer with an adhesive layer disposed between the dielectric layer and the conductor layer, wherein the conductor layer has a smooth surface facing the dielectric layer, the smooth surface having a roughness (Rz) of less than two microns.

In Example 2, the subject matter of Example 1, wherein the conductor layer comprises copper foil.

In Example 3, the printed circuit board of Example 1, wherein the conductor layer is etched to comprise a plurality of signal traces.

In Example 4, the printed circuit board of Example 3, further comprising a solder mask layer disposed on the etched conductor layer.

In Example 5, the printed circuit board of Example 1, wherein the adhesive layer comprises a resin made of at least a perfluoroalkoxy copolymer.

In Example 6, the printed circuit board of Example 1, further comprising a second adhesive layer disposed between the dielectric layer and the reference layer, wherein the reference layer has a second smooth surface facing the dielectric layer, the second smooth surface having a roughness (Rz) of less than two microns.

Example 7 is a multi-layer printed circuit board comprising: 1) a first core comprising a first reference layer and a first signal layer; 2) a first dielectric layer disposed on the first reference layer; 2) a first conductor layer adhered to the first dielectric layer with a first adhesive layer disposed between the first conductor layer and the first dielectric layer, wherein the first conductor layer has a smooth surface facing the first dielectric layer; 3) a second core comprising a second reference layer and a second signal layer; 4) a second dielectric layer disposed on the second reference layer; and 5) a second conductor layer adhered to the second dielectric layer with a second adhesive layer disposed between the second conductor layer and the second dielectric layer, wherein the second conductor layer has a smooth surface facing the second dielectric layer, and wherein each smooth surface has a roughness (Rz) of less than two microns.

In Example 8, the multi-layer printed circuit board of Example 7, wherein the first conductor layer and the second conductor layer comprise copper foil.

In Example 9, the multi-layer printed circuit board of Example 7, wherein the first signal layer and the second signal layer are etched to comprise a plurality of signal traces.

In Example 10, the multi-layer printed circuit board of Example 7, wherein the first conductor layer is etched to comprise a plurality of signal traces, further comprising a first solder mask layer disposed on the etched first conductor layer.

In Example 11, the multi-layer printed circuit board of Example 7, wherein the second conductor layer is etched to comprise a plurality of signal traces, further comprising a second solder mask layer disposed on the etched second conductor layer.

In Example 12, the multi-layer printed circuit board of Example 7, wherein the first adhesive layer and the second adhesive layer each comprise a resin made of at least a perfluoroalkoxy copolymer.

In Example 13, the multi-layer printed circuit board of Example 7, further comprising: 1) a third dielectric layer disposed between the first signal layer and the second signal layer; 2) a third adhesive layer disposed between the first reference layer and the first dielectric layer, wherein the first reference layer has a smooth surface facing the first dielectric layer; and 3) a fourth adhesive layer disposed between the first signal layer and the third dielectric layer, wherein the first signal layer has a smooth surface facing the third dielectric layer.

In Example 14, the multi-layer printed circuit board of Example 7, further comprising: 1) a third dielectric layer disposed between the first signal layer and the second signal layer; 2) a third adhesive layer disposed between the second reference layer and the second dielectric layer, wherein the second reference layer has a smooth surface facing the second dielectric layer; and 3) a fourth adhesive layer disposed between the second signal layer and the third dielectric layer, wherein the second signal layer has a smooth surface facing the third dielectric layer.

Example 15 is a method of forming a printed circuit board comprising: 1) disposing a first dielectric layer on a first reference layer; 2) disposing a first combination layer on the first dielectric layer, the first combination layer comprising a first adhesive layer disposed on a first conductor layer, the first adhesive layer being in physical contact with the first dielectric layer, wherein the first conductor layer is smooth on at least a first surface that is adjacent to the first adhesive layer, the first surface having a roughness (Rz) of less than two microns; and 3) heating a combination of the first reference layer, the first dielectric layer, and the first combination layer.

In Example 16, the method of Example 15, further comprising etching the first conductor layer to comprise a plurality of signal traces.

In Example 17, the method of Example 16, further comprising disposing a solder mask layer on the etched first conductor layer.

In Example 18, the method of Example 15, wherein the first adhesive layer comprises a resin made of at least a perfluoroalkoxy copolymer.

In Example 19, the method of Example 15, wherein the first reference layer is within a core, the core further comprising a first signal layer opposite to the first reference layer, and wherein, before the heating, the method further comprising: 1) disposing a second dielectric layer on the core; 2) disposing a second adhesive layer between the first reference layer and the first dielectric layer, wherein the first reference layer has a smooth surface facing the first dielectric layer; and 3) disposing a third adhesive layer between the first signal layer and the second dielectric layer, wherein the first signal layer has a smooth surface facing the second dielectric layer.

Example 20 is a method comprising: 1) disposing a first dielectric layer on a first combination layer, the first combination layer comprising a first adhesive layer disposed on a first conductor layer, the first adhesive layer being in physical contact with the first dielectric layer, wherein the first conductor layer is smooth on at least a first surface that is adjacent to the first adhesive layer; 2) disposing a first core on the first dielectric layer, the first core comprising a first reference layer and a first signal layer; 3) disposing a second dielectric layer on the first signal layer of the first core; 4) disposing a second core on the second dielectric layer, the second core comprising a second reference layer and a second signal layer; 5) disposing a third dielectric layer on the second reference layer of the second core; 6) disposing a second combination layer on the third dielectric layer, the second combination layer comprising a second adhesive layer disposed on a second conductor layer, the second adhesive layer being in physical contact with the third dielectric layer, wherein the second conductor layer is smooth on at least a second surface that is adjacent to the second adhesive layer, and wherein the first surface and the second surface each have a roughness (Rz) of less than two microns; and 7) heating a combination of the first and second cores, the first, second, and third dielectric layers, and the first and second combination layers.

In Example 21, the method of Example 20, wherein the first adhesive layer and the second adhesive layer comprise a resin made of at least a perfluoroalkoxy copolymer.

In Example 22, the method of Example 20, further comprising: 1) etching the first signal layer to comprise a first plurality of signal traces; 2) etching the second signal layer to comprise a second plurality of signal traces; 3) etching the first conductor layer to comprise a third plurality of signal traces; and 4) etching the second conductor layer to comprise a fourth plurality of signal traces.

In Example 23, the method of Example 22, further comprising: 1) disposing a first solder mask layer on the etched first conductor layer; and 2) disposing a second solder mask layer on the etched second conductor layer.

In Example 24, the method of Example 22, wherein, before the heating, the method further comprising: 1) disposing a third adhesive layer between the second reference layer and the third dielectric layer, wherein the second reference layer has a smooth surface facing the third dielectric layer; and 2) disposing a fourth adhesive layer between the second signal layer and the second dielectric layer, wherein the second signal layer has a smooth surface facing the second dielectric layer.

Various embodiments can have different combinations of the structural features described above. For instance, all optional features of the computing system described above can also be implemented with respect to the method or process described herein and specifics in the examples can be used anywhere in one or more embodiments.

While the present disclosure has been described with respect to a limited number of embodiments, those skilled in the art will appreciate numerous modifications and variations therefrom. It is intended that the appended claims cover all such modifications and variations as fall within the true spirit and scope of this present disclosure.

In the description herein, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present disclosure. It will be apparent, however, to one skilled in the art that these specific details need not be employed to practice the present disclosure. In other instances, well known components or methods, such as specific and alternative processor architectures, specific logic circuits/code for described algorithms, specific firmware code, specific interconnect operation, specific logic configurations, specific manufacturing techniques and materials, specific compiler embodiments, specific expression of algorithms in code, specific power down and gating techniques/logic and other specific operational details of computer system have not been described in detail in order to avoid unnecessarily obscuring the present disclosure.

The embodiments may be described with reference to components in high speed I/O (HSIO) devices in specific integrated circuits, such as in computing platforms or microprocessors. The embodiments can also be applicable to other types of integrated circuits and programmable logic devices. For example, the disclosed embodiments are not limited to desktop computer systems or portable computers, such as the Intel® Ultrabooks™ computers, and can be also used in other devices, such as handheld devices, tablets, other thin notebooks, systems on a chip (SoC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. It is described that the system can be any kind of computer or embedded system. The disclosed embodiments can especially be used for low-end devices, like wearable devices (e.g., watches), electronic implants, sensory and control infrastructure devices, controllers, supervisory control and data acquisition (SCADA) systems, or the like. Moreover, the apparatuses, methods, and systems described herein are not limited to physical computing devices, but can also relate to software optimizations for energy conservation and efficiency. As will become readily apparent in the description below, the embodiments of methods, apparatuses, and systems described herein (whether in reference to hardware, firmware, software, or a combination thereof) are vital to a 'green technology' future balanced with performance considerations.

Although the embodiments herein are described with reference to a processor, other embodiments are applicable to other types of integrated circuits and logic devices. Similar techniques and teachings of embodiments of the present disclosure can be applied to other types of circuits or semiconductor devices that can benefit from higher pipeline throughput and improved performance. The teachings of embodiments of the present disclosure are applicable to any processor or machine that performs data manipulations. However, the present disclosure is not limited to processors or machines that perform 512 bit, 256 bit, 128 bit, 64 bit, 32 bit, or 16 bit data operations and can be applied to any processor and machine in which manipulation or management of data is performed. In addition, the description herein provides examples, and the accompanying drawings show various examples for the purposes of illustration. However, these examples should not be construed in a limiting sense as they are merely intended to provide examples of embodiments of the present disclosure rather than to provide an exhaustive list of all possible embodiments of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) can refer to the combination of the microcontroller and the non-transitory medium. Often module boundaries that are illustrated as separate commonly vary and potentially overlap. For example, a first and a second module can share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate can provide a 0 or a 1 during operation. But a logic gate 'configured to' provide an enable signal to a clock does not include every potential logic gate that can provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'to,' 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics can be combined in any suitable manner in one or more embodiments.

In the foregoing specification, a detailed description has been given with reference to specific exemplary embodiments. It will, however, be evident that various modifications and changes can be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but can refer to different and distinct embodiments, as well as potentially the same embodiment.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like. The blocks described herein can be hardware, software, firmware or a combination thereof.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "contacting," "coupling," "conducting," "transmitting," "receiving," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. Also, the terms "first," "second," "third," "fourth," etc. as used herein are meant as labels to distinguish among different elements and can not necessarily have an ordinal meaning according to their numerical designation.

What is claimed is:

1. A multi-layer printed circuit board comprising:
   a first core comprising a first reference layer and a first signal layer;
   a first dielectric layer disposed on the first reference layer;
   a first conductor layer adhered to the first dielectric layer with a first adhesive layer disposed between the first conductor layer and the first dielectric layer, wherein the first conductor layer has a smooth surface facing the first dielectric layer;
   a second core comprising a second reference layer and a second signal layer;
   a second dielectric layer disposed on the second reference layer; and
   a second conductor layer adhered to the second dielectric layer with a second adhesive layer disposed between the second conductor layer and the second dielectric layer, wherein the second conductor layer has a smooth surface facing the second dielectric layer;
   a third dielectric layer disposed between the first signal layer and the second signal layer;
   a third adhesive layer disposed between the first reference layer and the first dielectric layer, wherein the first reference layer has a smooth surface facing the first dielectric layer; and
   a fourth adhesive layer disposed between the first signal layer and the third dielectric layer, wherein the first signal layer has a smooth surface facing the third dielectric layer, and wherein each smooth surface has a roughness (Rz) of less than two microns.

2. The multi-layer printed circuit board of claim 1, wherein the first conductor layer and the second conductor layer comprise copper foil.

3. The multi-layer printed circuit board of claim 1, wherein the first signal layer and the second signal layer are etched to comprise a plurality of signal traces.

4. The multi-layer printed circuit board of claim 1, wherein the first conductor layer is etched to comprise a plurality of signal traces, further comprising a first solder mask layer disposed on the etched first conductor layer.

5. The multi-layer printed circuit board of claim 1, wherein the second conductor layer is etched to comprise a plurality of signal traces, further comprising a second solder mask layer disposed on the etched second conductor layer.

6. The multi-layer printed circuit board of claim 1, wherein the first adhesive layer and the second adhesive layer each comprise a resin made of at least a perfluoroalkoxy copolymer.

7. The multi-layer printed circuit board of claim 1, further comprising:
   a fifth adhesive layer disposed between the second reference layer and the second dielectric layer, wherein the second reference layer has a smooth surface facing the second dielectric layer; and
   a sixth adhesive layer disposed between the second signal layer and the third dielectric layer, wherein the second signal layer has a smooth surface facing the third dielectric layer.

* * * * *